United States Patent
Wetzel et al.

(10) Patent No.: US 12,399,220 B2
(45) Date of Patent: Aug. 26, 2025

(54) CIRCUIT BREAKER MECHANISM POSITION SENSOR SYSTEMS

(71) Applicant: Schneider Electric USA, Inc., Andover, MA (US)

(72) Inventors: Skylar Frances Wetzel, Cedar Rapids, IA (US); Juan Ignacio Melecio, North Liberty, IA (US); Leonardo Rangel Martinez, Iowa City, IA (US)

(73) Assignee: Schneider Electric USA, Inc., Boston, MA (US)

( * ) Notice: Subject to any disclaimer, the term of this patent is extended or adjusted under 35 U.S.C. 154(b) by 226 days.

(21) Appl. No.: 18/125,424

(22) Filed: Mar. 23, 2023

(65) Prior Publication Data

US 2024/0219466 A1 Jul. 4, 2024

Related U.S. Application Data

(60) Provisional application No. 63/436,455, filed on Dec. 30, 2022.

(51) Int. Cl.
*G01R 31/327* (2006.01)
*H01H 71/04* (2006.01)

(52) U.S. Cl.
CPC ......... *G01R 31/3272* (2013.01); *H01H 71/04* (2013.01)

(58) Field of Classification Search
CPC ............. H01H 71/04; H01H 2071/044; G01R 31/327; G01R 31/3271; G01R 31/3272; G01R 31/3274; G01R 31/3275; G01R 31/333; G01R 31/3333; G01R 31/3336
See application file for complete search history.

(56) References Cited

U.S. PATENT DOCUMENTS

| 4,342,974 A * | 8/1982 | Nakano | H01H 71/1009 335/10 |
| 4,706,073 A * | 11/1987 | Vila Masot | H01H 71/04 337/206 |
| 4,808,958 A * | 2/1989 | Hewitt | G01D 5/2291 336/224 |
| 4,947,284 A * | 8/1990 | Munyon | H01H 83/12 335/254 |
| 5,015,998 A * | 5/1991 | Ellis | G01D 5/2225 336/134 |

(Continued)

OTHER PUBLICATIONS

Written Opinion of the International Searching Authority dated Apr. 1, 2024 for corresponding International Application No. PCT/US 23/85024, 17 pages.

(Continued)

*Primary Examiner* — Steven L Yeninas
(74) *Attorney, Agent, or Firm* — Troutman Pepper Locke LLP

(57) ABSTRACT

A circuit breaker assembly can include a mechanism configured to be actuated by an operator. The mechanism can be configured to move between a first position and a second position to change a state of a contactor between a closed state and an open state. The circuit breaker assembly can include a reluctance sensor system operatively connected to the mechanism and configured to determine a position and/or a motion of the mechanism as a function of magnetic reluctance. The reluctance in the reluctance sensor system can change as a function of mechanism position.

21 Claims, 13 Drawing Sheets

(56) References Cited

U.S. PATENT DOCUMENTS

| | | | | |
|---|---|---|---|---|
| 5,172,298 | A * | 12/1992 | Shimizu | F02D 35/0007 |
| | | | | 324/207.16 |
| 5,617,023 | A * | 4/1997 | Skalski | G01D 5/204 |
| | | | | 324/207.17 |
| 6,043,644 | A * | 3/2000 | de Coulon | G01D 5/2208 |
| | | | | 324/164 |
| 7,317,371 | B1 * | 1/2008 | Carroll | G01D 5/2291 |
| | | | | 336/130 |
| 7,986,501 | B2 * | 7/2011 | Kamor | H01H 83/04 |
| | | | | 361/42 |
| 10,332,675 | B2 * | 6/2019 | Esakki | H01F 29/10 |
| 2007/0194872 | A1 * | 8/2007 | Pfister | H01F 7/066 |
| | | | | 335/229 |
| 2011/0267722 | A1 * | 11/2011 | Annis | H01H 71/2454 |
| | | | | 361/49 |
| 2014/0055126 | A1 * | 2/2014 | Seeley | H02P 23/26 |
| | | | | 324/207.2 |
| 2015/0145621 | A1 * | 5/2015 | Connell | H01H 47/223 |
| | | | | 335/147 |
| 2016/0131503 | A1 * | 5/2016 | Goto | G01D 5/2216 |
| | | | | 324/207.17 |
| 2020/0225063 | A1 * | 7/2020 | Hess | G01D 5/2291 |

OTHER PUBLICATIONS

International Search Report dated Apr. 1, 2024 for corresponding International Application No. PCT/US 23/85024, 8 pages.

* cited by examiner

CIRCUIT BREAKER MECHANISM POSITION SENSOR SYSTEMS

CROSS-REFERENCE TO RELATED APPLICATIONS

This application claims priority to and the benefit of U.S. Provisional Application No. 63/436,455, filed Dec. 30, 2022, the entire contents of which are herein incorporated by reference in their entirety.

FIELD

This disclosure relates to position sensor systems, e.g., for circuit breakers.

BACKGROUND

Certain proposed designs for remote controlled circuit breakers include an ON/OFF switch that notifies the microcontroller when a mechanism driven by a motor moves into or out of the switch reach activation zone. Such systems cannot alone provide information regarding the true position of the slider, and any motor health monitoring, e.g., when there is no motor movement even after a command (e.g., due to a locked or open/damaged motor).

Such conventional methods and systems have generally been considered satisfactory for their intended purpose. However, there is still a need in the art for improvements. The present disclosure provides a solution for this need.

SUMMARY

A circuit breaker assembly can include a mechanism configured to be actuated by an operator. The mechanism can be configured to move between a first position and a second position to change a state of a contactor between a closed state and an open state. The circuit breaker assembly can include a reluctance sensor system operatively connected to the mechanism and configured to determine a position and/or a motion of the mechanism as a function of magnetic reluctance. The reluctance in the reluctance sensor system can change as a function of mechanism position.

The reluctance sensor system can include a reluctance variation device, and a sense inductor disposed in magnetic communication with the reluctance variation device. The sense inductor can be configured to sense a magnetic field flux and output a sense signal. For example, the reluctance variation device can be configured to move relative to the sense inductor.

The reluctance sensor system can further include a primary inductor configured to generate a reference magnetic field. The primary inductor and the sense inductor can be fixed relative to each other, for example.

The reluctance variation device can be disposed on, within, or form a portion of the mechanism. For example, the mechanism can be configured to move relative to the sense inductor and the primary inductor such that the reluctance variation device is configured to move with the mechanism relative to the sense inductor and the primary inductor.

The assembly can include a position module operatively connected to the sense inductor and configured to determine a position of the mechanism based on the sense signal. The position module can be operatively connected to primary inductor to send a reference signal to the primary inductor to cause the primary inductor to output the reference magnetic field.

In certain embodiments, the reluctance variation device can be a plunger. The plunger can be configured to pass through both the sense inductor and the primary inductor. The sense inductor and the primary inductor can be coaxial coils, for example. The plunger can have a bar shape and can be configured to pass axially through a center of each of the sense inductor and the primary inductor.

In certain embodiments, the reluctance variation device can be a structure comprising a shape or composition that provides a varying magnetic effect. In certain embodiments, the sense coil and the primary coil can be non-coaxial. For example, the sense inductor and the primary inductor can be coils that are adjacent and have parallel, non-coaxial center axes. In certain embodiments, the system can include a common conductive core disposed within the sense inductor and the primary inductor. For example, the sense inductor, the primary inductor, and the reluctance variation device can be configured to form a magnetic loop, wherein a relative position of the reluctance variation device affects the reluctance of the magnetic loop such that the reference magnetic field can be affected which changes the magnetic field flux sensed by the sense inductor.

The reluctance variation device can be a wedge shape with a varying thickness. In certain embodiments, the reluctance variation device can have a plate shape with a varying ferromagnetic and/or paramagnetic composition. In certain embodiments, the reluctance variation device can be disposed on a lateral side of the mechanism. The reluctance variation device can be configured to move over the sense inductor and the primary inductor to change the magnetic field flux sensed by the sense inductor.

The reluctance variation device can be configured to be rotationally moved over the sense inductor and the primary inductor to change the magnetic field flux sensed by the sense inductor. In certain embodiments, the mechanism can be a motor operated slider. In certain embodiments, the mechanism can be a mechanical breaker handle. Any suitable circuit breaker mechanism or combination thereof to include the reluctance variation device is contemplated herein. For example, in certain embodiments, a circuit breaker can include a reluctance variation device on both a mechanical breaker handle and a motor operated slider, and also have one or more sense inductors/primary coils associated with each reluctance variation device.

In certain embodiments, the assembly can include a control module operatively connected to the reluctance sensor system to receive the position and/or the motion of the mechanism. The control module can be configured to control a motor connected to the mechanism as a function of the position and/or the motion of the mechanism. For example, in certain embodiments, the control module can be configured to position the mechanism in a denial-of-service position such that a user cannot manually or remotely move the contactor to the closed state from the open state (e.g., the position of which can be a function of the mechanical assembly of the circuit breaker that is configured to mechanically disable manual handle control). For example, the denial-of-service position can be between the first position and the second position.

In accordance with at least one aspect of this disclosure, a circuit breaker assembly can include a mechanism configured to be actuated by an operator. The mechanism can be configured to move between a first position and a second position to change a state of a contactor between a closed state and an open state. The assembly can include a plunger disposed on, within, or forming a portion of the mechanism. The assembly can include a sense inductor disposed in magnetic communication with the plunger. The sense inductor can be configured to sense a magnetic field flux and output a sense signal. The assembly can include a primary inductor configured to generate a reference magnetic field. The plunger can be configured to pass through both the sense inductor and the primary inductor. The relative position of the plunger can affect the reference magnetic field to effect the magnetic field flux sensed by the sense inductor. The mechanism can be configured to move relative to the sense inductor and the primary inductor such that plunger is configured to move relative to the sense inductor and the primary inductor. The assembly can include a position module operatively connected to the sense inductor and configured to determine a position of the mechanism based on the sense signal. The position module can be operatively connected to primary inductor to send a reference signal to the primary inductor to cause the primary inductor to output the reference magnetic field.

In accordance with at least one aspect of this disclosure, a circuit breaker assembly can include a mechanism configured to be actuated by an operator. The mechanism can be configured to move between a first position and a second position to change a state of a contactor between a closed state and an open state. A reluctance variation device can be disposed on, within, or forming a portion of the mechanism. The assembly can include a sense inductor disposed in magnetic communication with the reluctance variation device. The sense inductor can be configured to sense a magnetic field flux and output a sense signal. The sense inductor can include a primary inductor configured to generate a reference magnetic field. The mechanism can be configured to move relative to the sense inductor and the primary inductor such that reluctance variation device is configured to move relative to the sense inductor and the primary inductor. The sense inductor, the primary inductor, and the reluctance variation device can be configured to form a magnetic loop, and a relative position of the reluctance variation device can affect the reluctance of the magnetic loop such that the reference magnetic field is affected which changes the magnetic field flux sensed by the sense inductor. The assembly can include a position module operatively connected to the sense inductor and configured to determine a position of the mechanism based on the sense signal. The position module can be operatively connected to primary inductor to send a reference signal to the primary inductor to cause the primary inductor to output the reference magnetic field.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
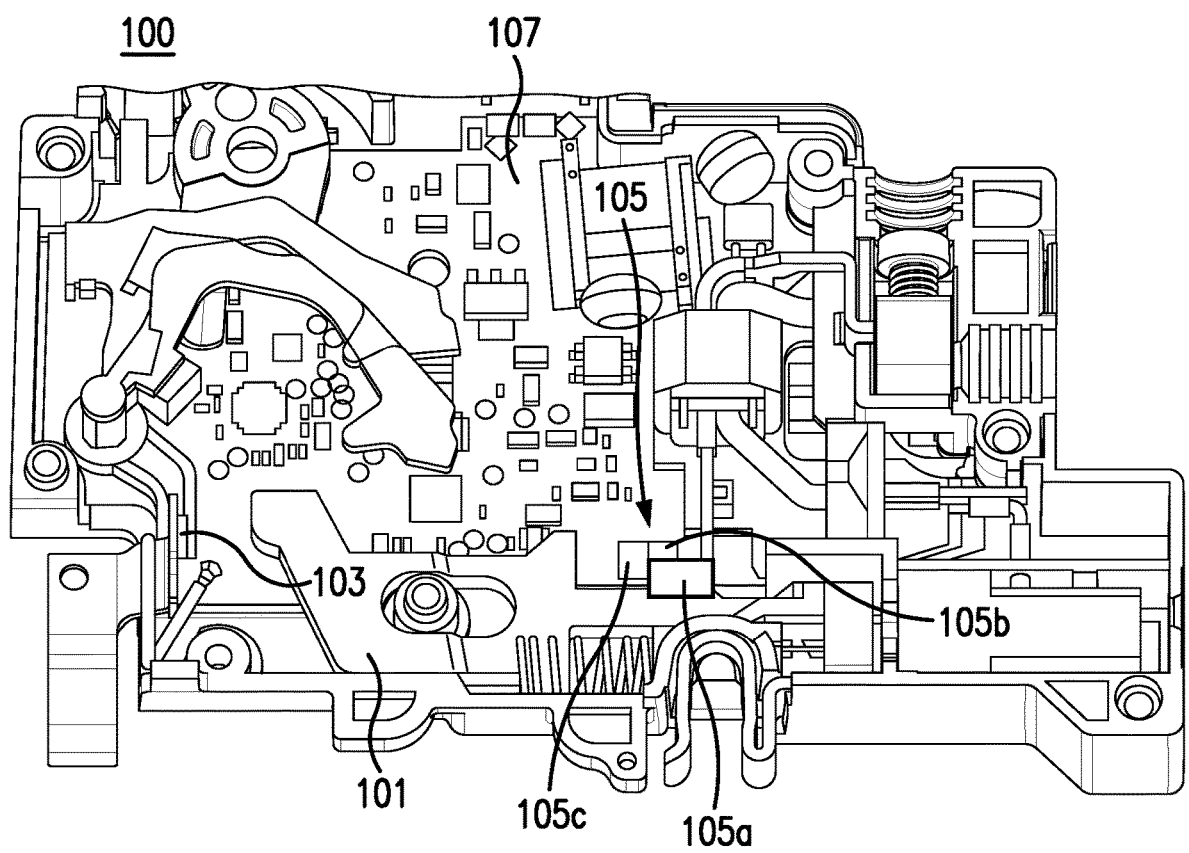
FIG. 1 is a perspective view of an embodiment of a circuit breaker assembly in accordance with this disclosure.

Reference will now be made to the drawings wherein like reference numerals identify similar structural features or aspects of the subject disclosure. For purposes of explanation and illustration, and not limitation, an illustrative view of an embodiment of an assembly in accordance with the disclosure is shown in FIG. 1 and is designated generally by reference character 100. Other embodiments and/or aspects of this disclosure are shown in FIGS. 2-13.

Figure 2:
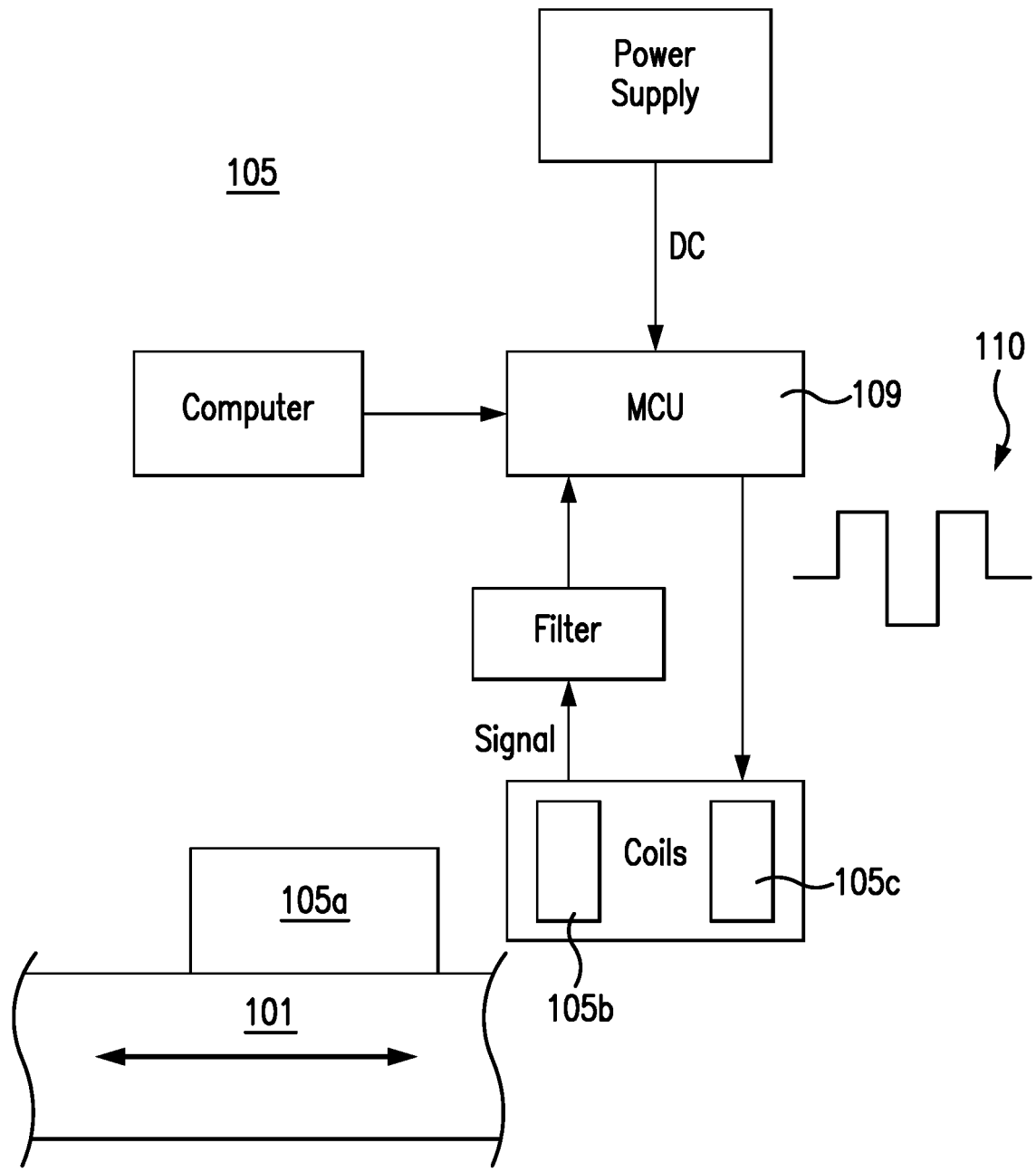
FIG. 2 is a system diagram of the embodiment of FIG. 1.

Referring to FIGS. 1 and 2, a circuit breaker assembly 100 can include a mechanism 101 configured to be actuated by an operator (e.g., manually or remotely, directly or indirectly). The mechanism 101 can be configured to move between a first position (e.g., to the right as shown) and a second position (e.g., to the left as shown) to change a state of a contactor 103 between a closed state (where electricity can flow through the breaker to a load) and an open state (where electricity cannot flow through the terminal to a load). The circuit breaker assembly 100 can include a reluctance sensor system 105 operatively connected to the mechanism 101 and configured to determine a position and/or a motion of the mechanism 101 as a function of magnetic reluctance. The reluctance in the reluctance sensor system 105 can change as a function of mechanism position, for example.

The reluctance sensor system 105 can include a reluctance variation device 105a, and a sense inductor 105b disposed in magnetic communication with the reluctance variation device 105a. The sense inductor 105b can be configured to sense a magnetic field flux and output a sense signal. For example, the reluctance variation device 105a can be configured to move relative to the sense inductor 105b, e.g., to modify the magnetic field flux seen by the sense inductor 105b. The source of magnetic field flux can be any suitable source in suitable proximity (e.g., at a fixed location relative to) to the sense inductor 105b to produce a changing magnetic field that is suitable for being detected and modified by the reluctance change device 105a.

In certain embodiments, the reluctance sensor system 105 can further include a primary inductor 105c configured to generate a reference magnetic field (e.g., that oscillates over time, e.g., as shown in FIG. 2). The primary inductor 105c and the sense inductor 105b can be fixed relative to each other, for example. For example, the primary inductor 105c and the sense inductor 105b can be fixed to a circuit board 107 in the assembly 100, e.g., in magnetic communication with each other.

In certain embodiments, the reluctance variation device 105a can be disposed on, within, or form a portion of the mechanism 101. The primary inductor 105c and the sense inductor 105b can be fixed to the circuit board 107 adjacent to the reluctance variation device 105a (e.g., providing a contactless relationship). For example, the mechanism 101 can be configured to move relative to the sense inductor 105b and the primary inductor 105c such that the reluctance variation device 105a is configured to move with the mechanism 101 relative to the sense inductor 105b and the primary inductor 105c. However, it is contemplated that the primary inductor 105c and the sense inductor 105b can be attached to the mechanism 101 to move with the mechanism 101 and the reluctance variation device 105a can be fixed to any suitable structure to be in magnetic communication with the primary inductor 105c and the sense inductor 105b.

The assembly 100 can include a position module 109 operatively connected to the sense inductor 105b and configured to determine a position of the mechanism 101 based on the sense signal. The position module 109 can be operatively connected to primary inductor 105c to send a reference signal 110 (e.g., to the primary inductor 105c to cause the primary inductor 105c to output the reference magnetic field).

Figure 3:
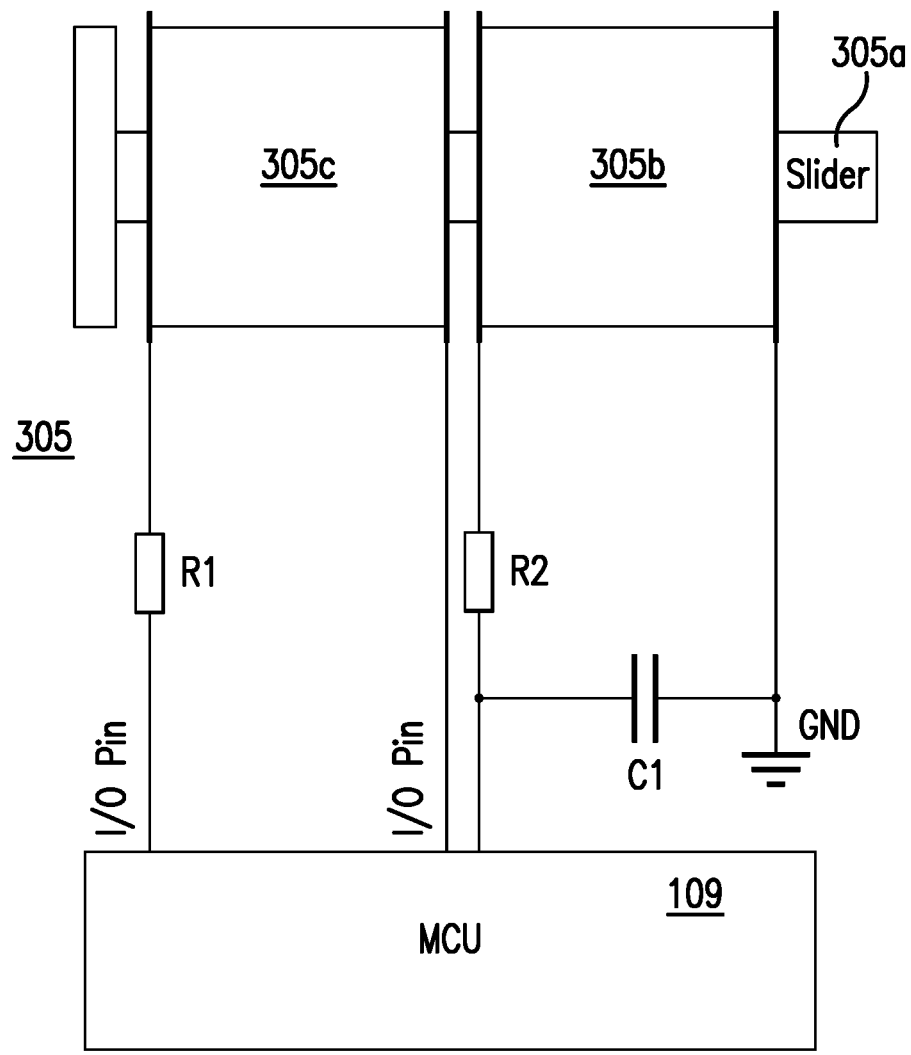
FIG. 3 is a schematic diagram of an embodiment of a reluctance sensor system in accordance with this disclosure.

In certain embodiments, referring additionally to reluctance sensor system 305 of FIGS. 3-6, the reluctance variation device 105a can be a plunger 305a. The plunger 305a can be configured to pass through both the sense inductor 305b and the primary inductor 305c, e.g., as shown in FIG. 3. As shown, the sense inductor 305b and the primary inductor 305c can be coaxial coils, for example. The sense inductor 305b and the primary inductor 305c can have any suitable number of turns forming the coils (e.g., 100 turns each). The plunger 305a can have a bar shape (e.g., a rounded core) and can be configured to pass axially through a center of each of the sense inductor 503b and the primary inductor 305c. The plunger 305a can be made of ferromagnetic or paramagnetic material, for example.

As shown, the primary inductor 305c can be connected to the position module 109 at each end of the coil (e.g., with a resistor R1 therebetween). The sense inductor 305b can be connected to the position module 109 at a first end of the coil, and to ground at a second end of the coil. A capacitor C1 can be connected between the first end and the second end of the sense inductor 305b, and a resistor R2 can be connected between the sense inductor 305b and the position module 109.

Figure 4:
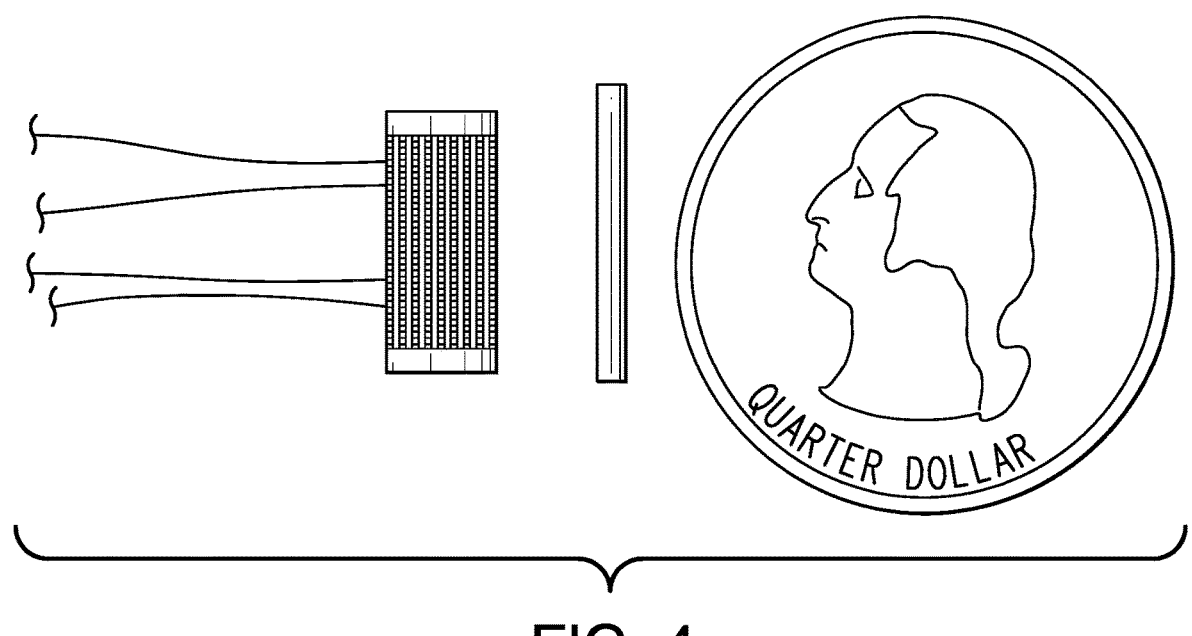
FIG. 4 shows an embodiment of a primary inductor and a sense inductor coaxially aligned next to an embodiment of a plunger in accordance with this disclosure.
Figure 5:
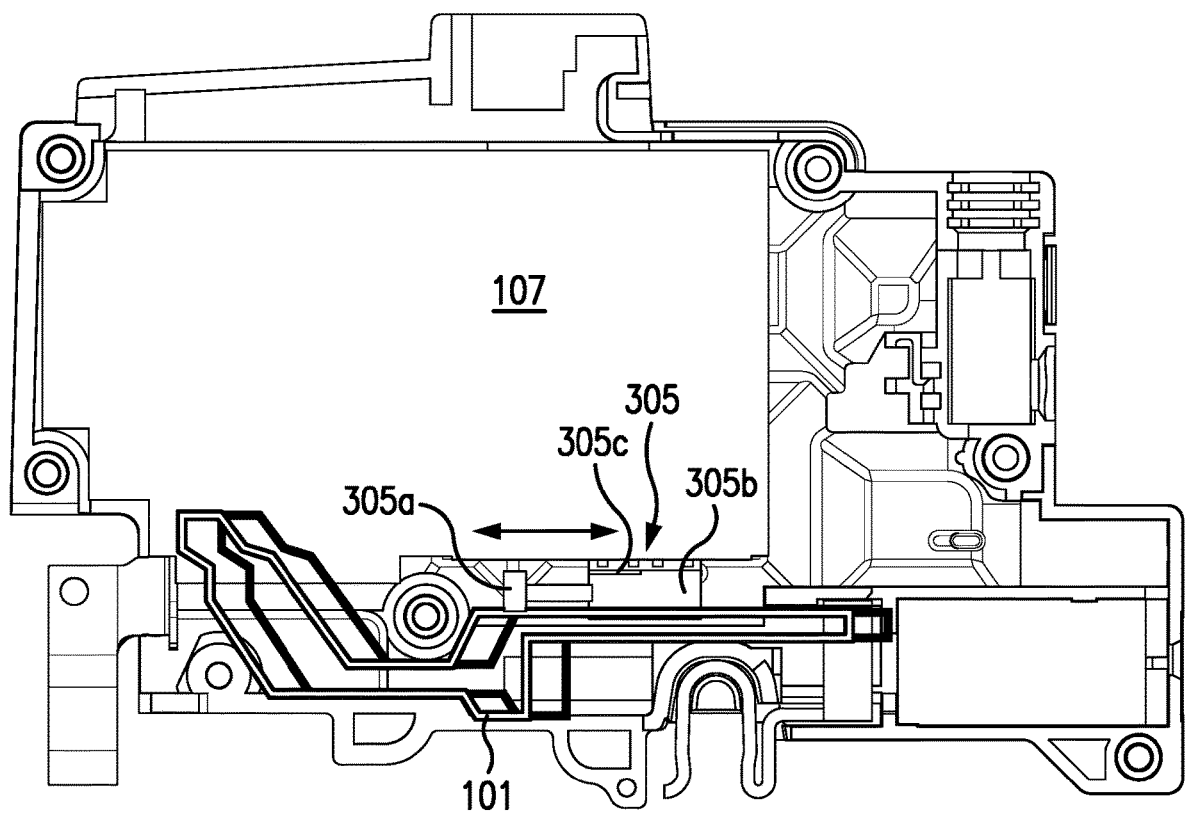
FIG. 5 shows a schematic diagram of the embodiment of FIG. 3, showing an outline of the mechanism connected to the plunger in two different positions.
Figure 6:
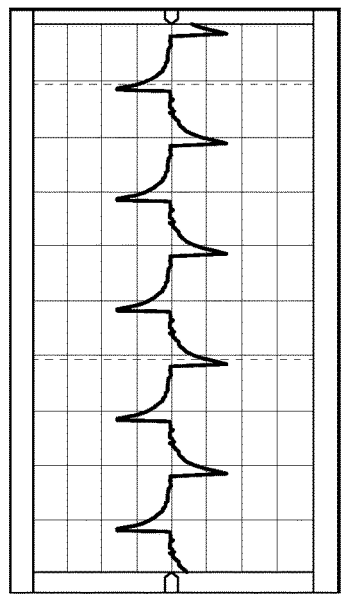
FIG. 6 illustrates a function of the embodiment of FIG. 3, showing a voltage peak from the sense inductor as a function of position of the plunger.
Figure 6:
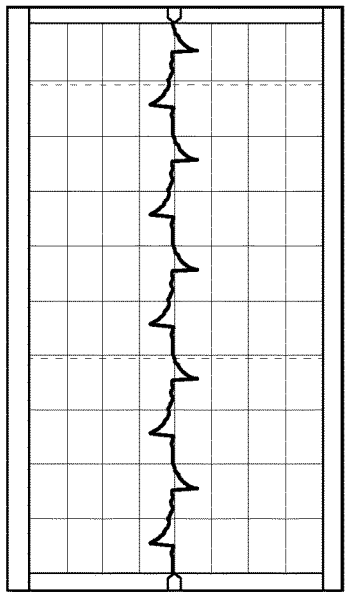
Figure 6:
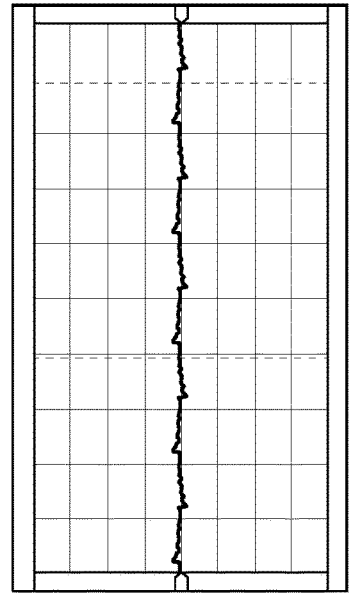
Figure 6:
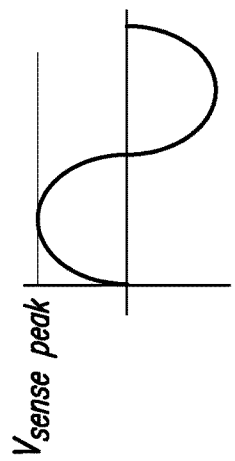
Figure 6:
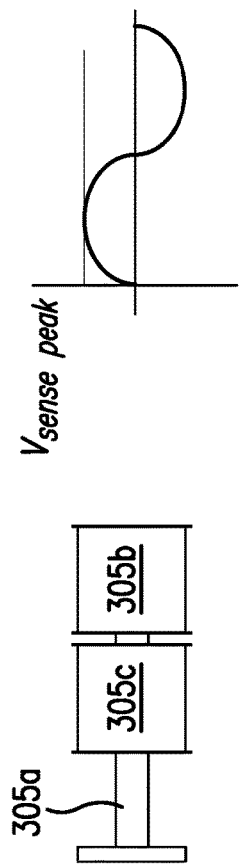
Figure 6:
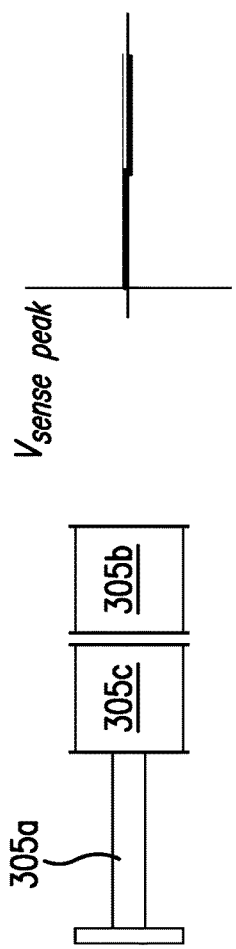
Figure 6:
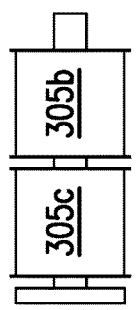
Figure 6:
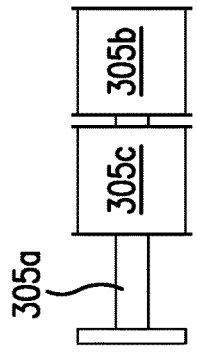
Figure 6:
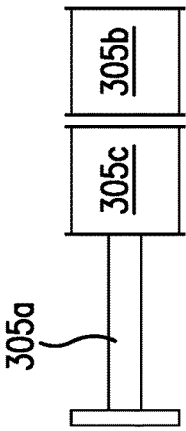

As shown in FIG. 4, the plunger 305a, the sense inductor 305b, and the primary inductor 305c can be very small and compact (e.g., smaller than a quarter) which aids in fitting the system within a standard size circuit breaker. As shown in FIG. 5, the plunger 305a can be configured to advance in and out of the sense inductor 305b and the primary inductor 305c with movement of the mechanism 101 (e.g., shown in two positions). FIG. 6 shows a voltage peak from the sense inductor 305b as a function of position of the plunger 305a. The position module 109 can output an oscillating signal (e.g., having constant frequency and amplitude) to create the reference magnetic field, sense the voltage peak output by the sense inductor 305b, and determine a position of the plunger 305a (and thus the mechanism 101) as a function of the voltage peak. While using the voltage peak is shown, any other signal characteristics that changes with position of the plunger 305a can be used by the position module 109 (e.g., frequency, phase shift, etc.) to determine position of the mechanism 101.

Figure 7:
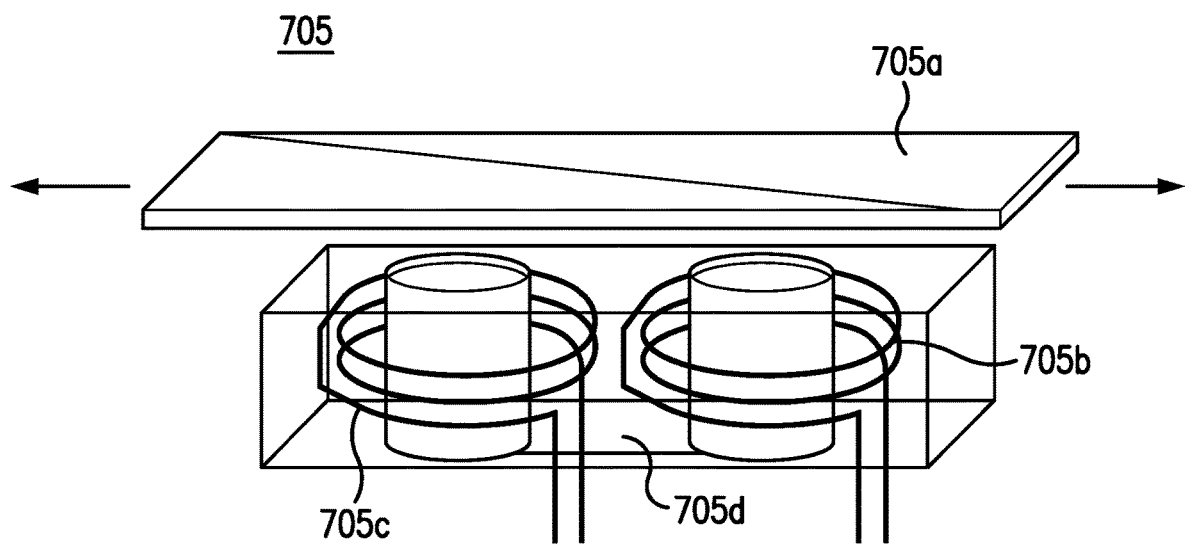
FIG. 7 is a schematic diagram of an embodiment of a reluctance sensor system in accordance with this disclosure, shown having a plate shaped reluctance variation device.
Figure 8:
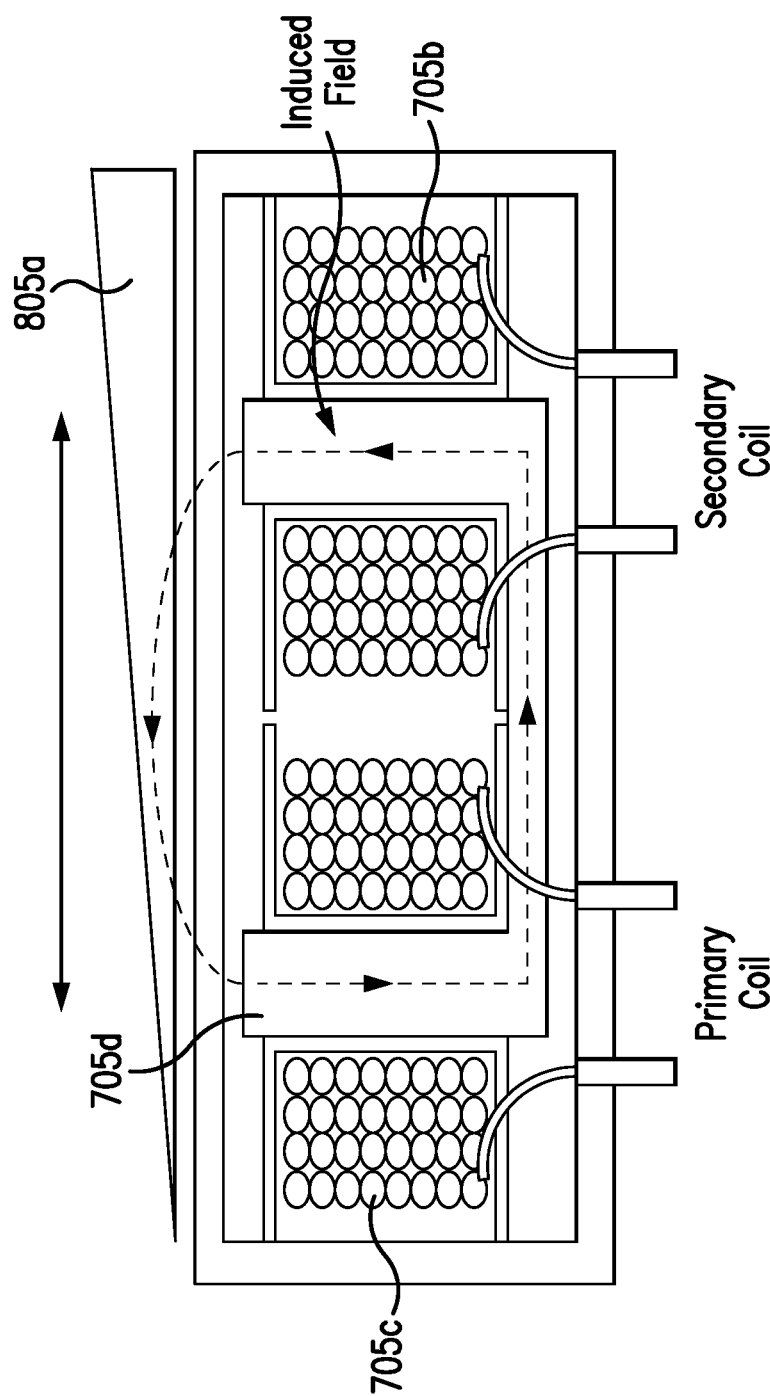
FIG. 8 is a cross-sectional view of the embodiment of FIG. 7, shown having a wedge shaped reluctance variation device.
Figure 9:
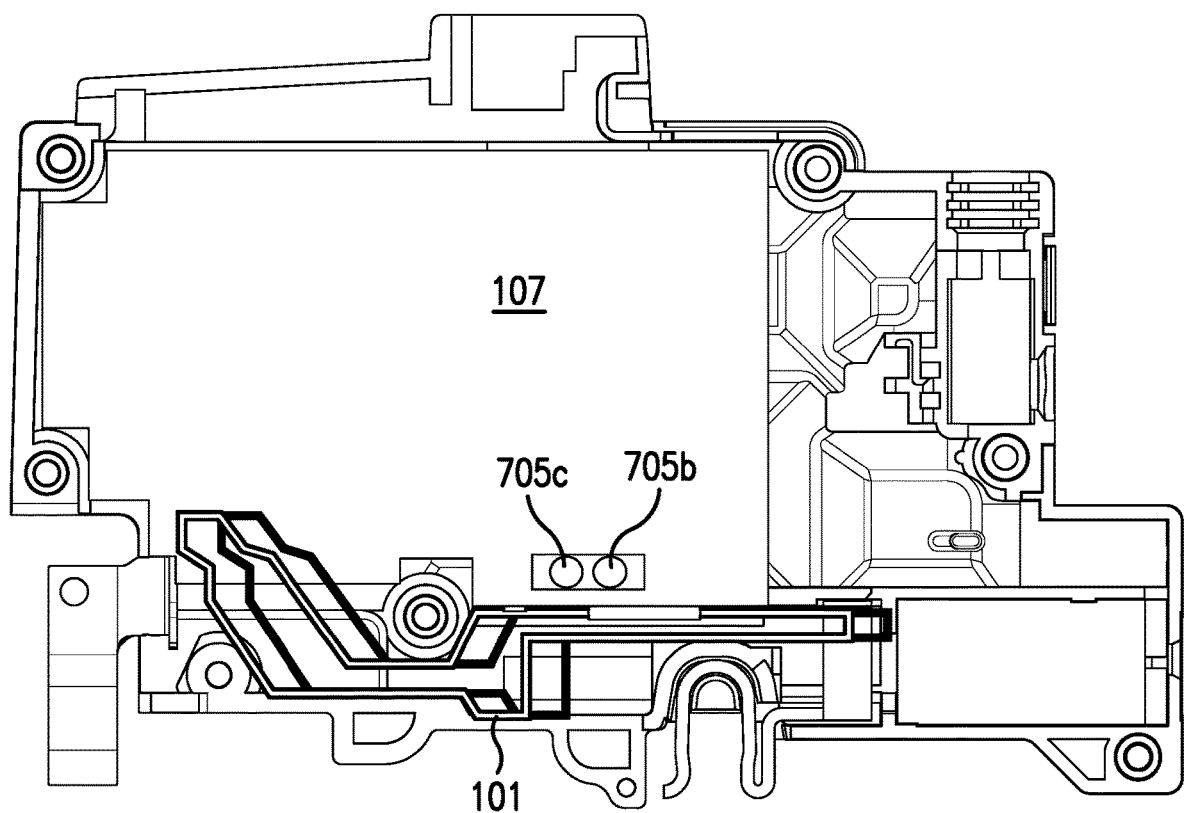
FIG. 9 is a schematic view of an embodiment of a circuit breaker assembly in accordance with this disclosure, showing a circuit board having a primary inductor and a sense inductor of the embodiment of FIG. 7 disposed thereon and facing toward the mechanism.
Figure 10:
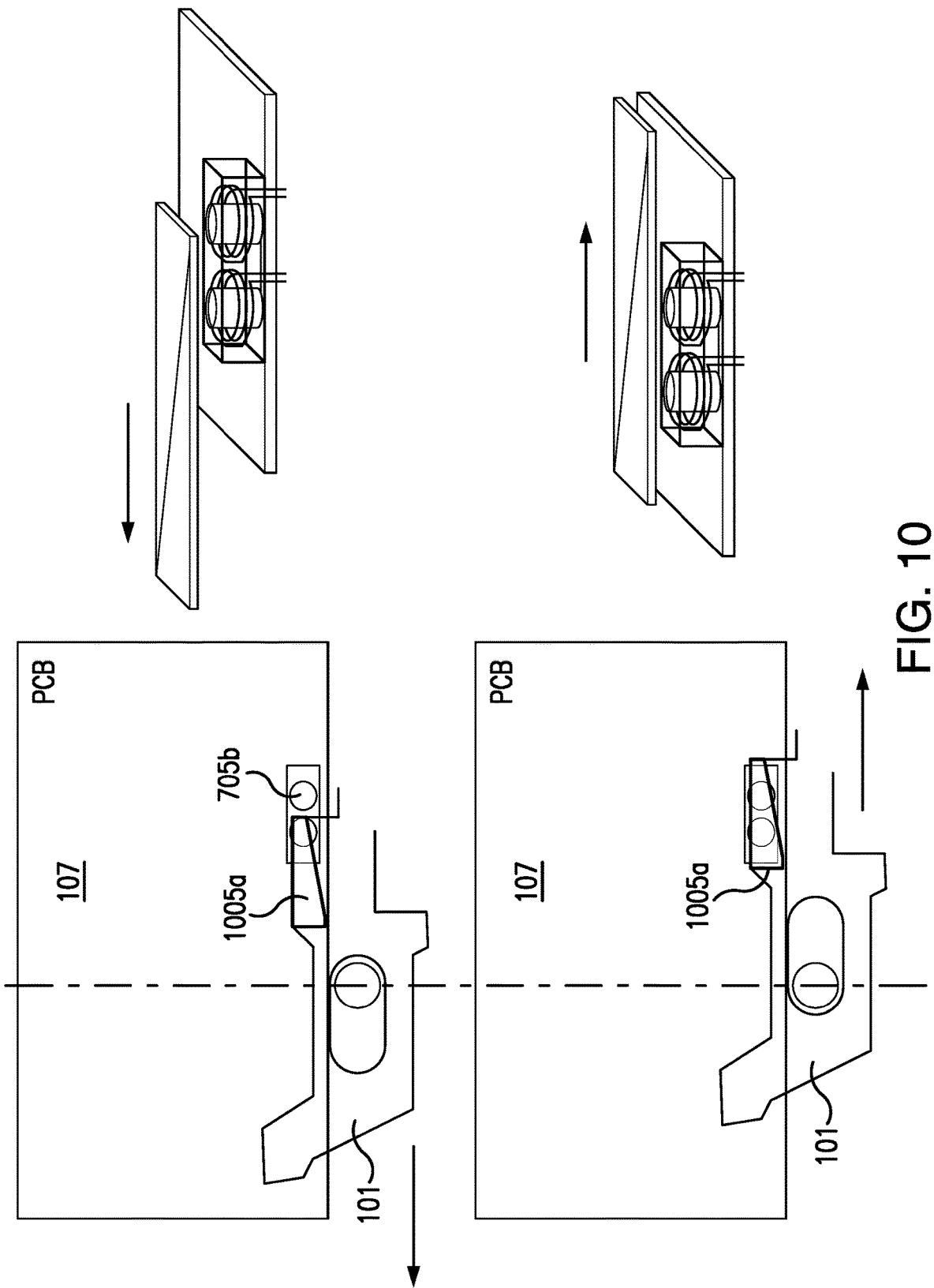
FIG. 10 shows a schematic diagram of the embodiment of FIG. 9, showing the mechanism in two positions.

In certain embodiments, referring additionally to the reluctance sensor system 705 of FIGS. 7-10, the reluctance variation device 105a can be a structure 705a, 805a, 1005a, comprising a shape or composition that provides a varying magnetic effect. For example, in certain embodiments, the structure 705a can have a plate shape with a varying ferromagnetic and/or paramagnetic composition (e.g., more ferromagnetic composition to the left that tapers off toward the right) as shown. In certain embodiments, e.g., as shown in FIG. 8 and FIG. 10, the structure 805a, 1005a can be a wedge shape with a varying thickness (e.g., in the vertical direction as shown in FIG. 8 and/or the lateral direction as shown in FIG. 10). Any structure having a varying magnetic effect that causes reluctance change as a function of its position relative to the sense inductor 705b (e.g., due to volumetric density change of ferromagnetic or paramagnetic material) is contemplated herein.

In certain embodiments, the sense coil 705b and the primary coil 705c can be non-coaxial. For example, the sense inductor 705b and the primary inductor 705c can be coils that are adjacent and have parallel, non-coaxial center axes (e.g., as shown in FIGS. 7 and 8). In certain embodiments, the system 705 can include a common conductive core 705d disposed within the sense inductor 705b and the primary inductor 705c. The sense inductor 705b, the primary inductor 705, and the reluctance variation device (e.g., the structure 705a, 805a, 1005a) can be configured to form a magnetic loop as shown in FIG. 8. A relative position of the reluctance variation device (e.g., the structure 705a, 805a, 1005a) affects the reluctance of the magnetic loop such that the reference magnetic field can be affected which changes the magnetic field flux sensed by the sense inductor 705b.

In certain embodiments, as shown in FIGS. 9 and 10, the reluctance variation device (e.g., the structure 705a, 805a, 1005a) can be disposed on a lateral side of the mechanism 101. Such an arrangement can minimize the footprint of the reluctance sensor system 705 in the circuit breaker assembly 100. For example, having a thin/flat structure 705a, 805a, 1005a can allow usage of existing space between the mechanism 101 and the circuit board 107, and also allow direct mounting of the inductors 705b, 705c to the circuit board 107 (e.g., where the position module 109 can be hosted). The reluctance variation device (e.g., the structure 705a, 805a, 1005a) can be configured to move over the sense inductor 705b and the primary inductor 705c to change the magnetic field flux sensed by the sense inductor 705b.

In certain embodiments, the mechanism 101 can be a motor operated slider, e.g., as shown in FIGS. 1-10. It is contemplated that any suitable moving part can be the mechanism 101 and that any suitable number of mechanisms can include a reluctance sensor system.

Figure 11:
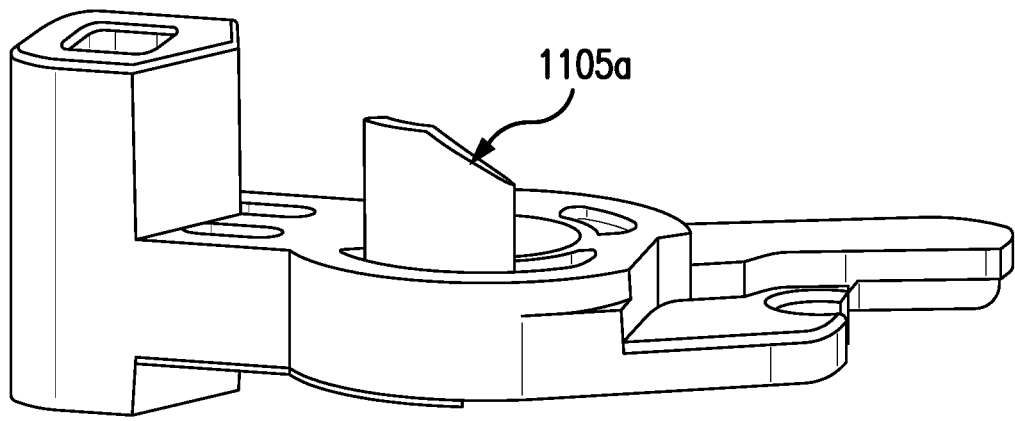
FIG. 11 is a perspective diagram of an embodiment of a mechanism in the form of a mechanical handle in accordance with this disclosure.

For example, the reluctance variation device (e.g., the structure 705a, 805a, 1005a) can be configured to be rotationally moved over the sense inductor 705b and the primary inductor 705c to change the magnetic field flux sensed by the sense inductor 705b. In certain embodiments, e.g., as shown in FIG. 11, the mechanism 1101 can be a mechanical breaker handle that is configured to be manually actuated by a user. The mechanism 1101 can have a reluctance variation device 1105a attached thereto (e.g., conformal to an outer surface thereof as shown in FIG. 12, and/or positioned in any other suitable location such as a laterally extending structure as shown in FIG. 11 to modify reluctance).

Figure 12:
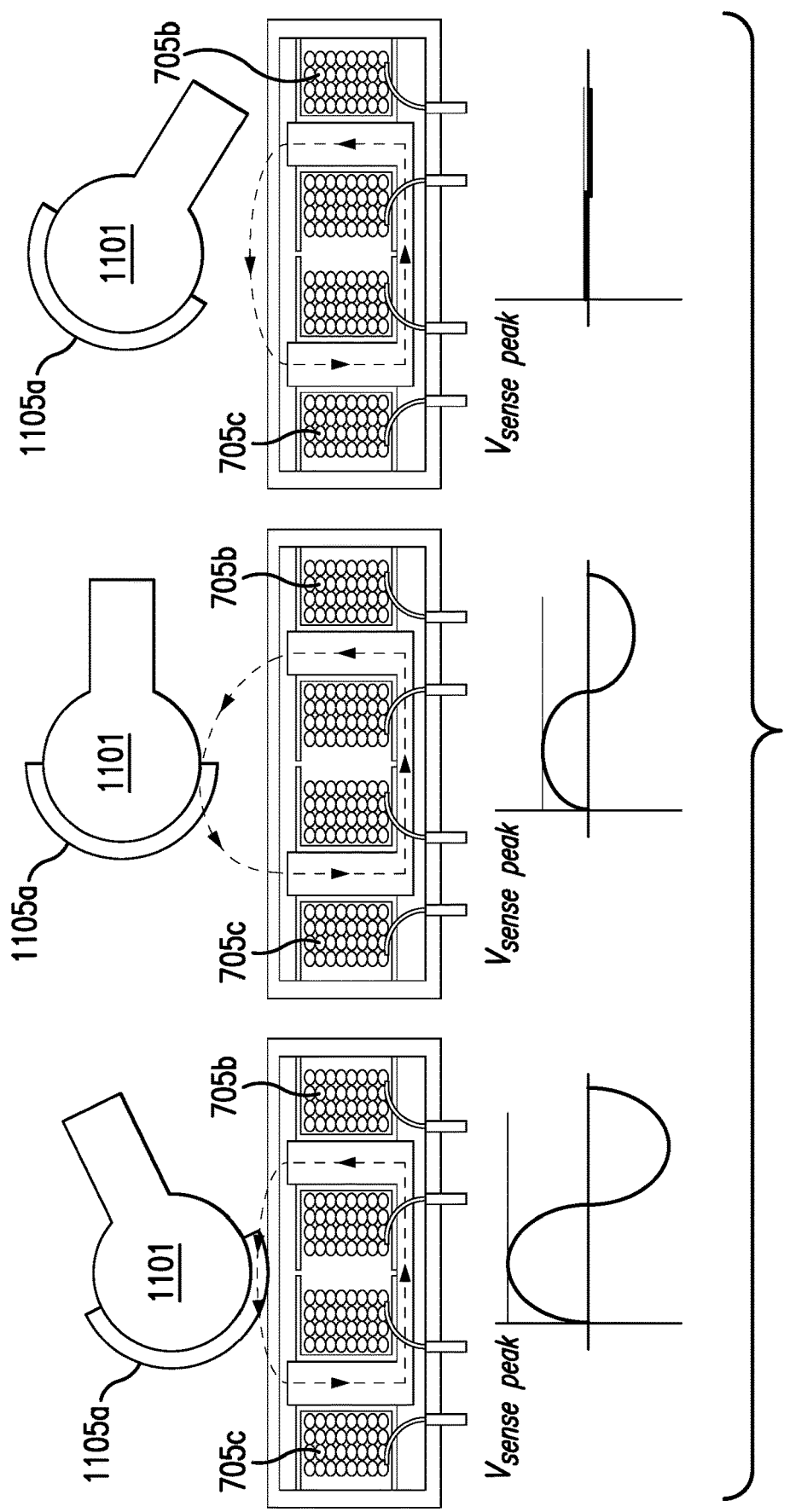
FIG. 12 illustrates a schematic diagram of an embodiment of an assembly in accordance with this disclosure, shown having the rotating mechanical handle of FIG. 12 with a reluctance variation device disposed thereon, and showing a voltage peak from the sense inductor as a function of position of the mechanical handle.

For example, as shown in FIG. 12, the mechanism 1101 can be configured to rotate and move the reluctance variation device 1105a closer to or away from the sense inductor 705b and/or the primary inductor 705c. In this regard, the mechanism 1101 can have an non-circle ellipsoid shape or other suitable shape and/or be pinned to rotate such that a distance between the reluctance variation device 1105a and the sense inductor 705b (and the primary inductor 705c) is changed when the mechanism 1101 is rotated. As shown in FIG. 12, this can modify the reluctance of the system and can result in a detectable signal difference in the output of the sense inductor 705b.

Any suitable circuit breaker mechanism or combination thereof to include the reluctance variation device 105a is contemplated herein. For example, in certain embodiments, a circuit breaker can include a reluctance variation device 105a, 705a, 805a, 1005a on both a mechanical breaker handle and a motor operated slider, and also have one or more sense inductors/primary coils associated with each reluctance variation device.

Figure 13:
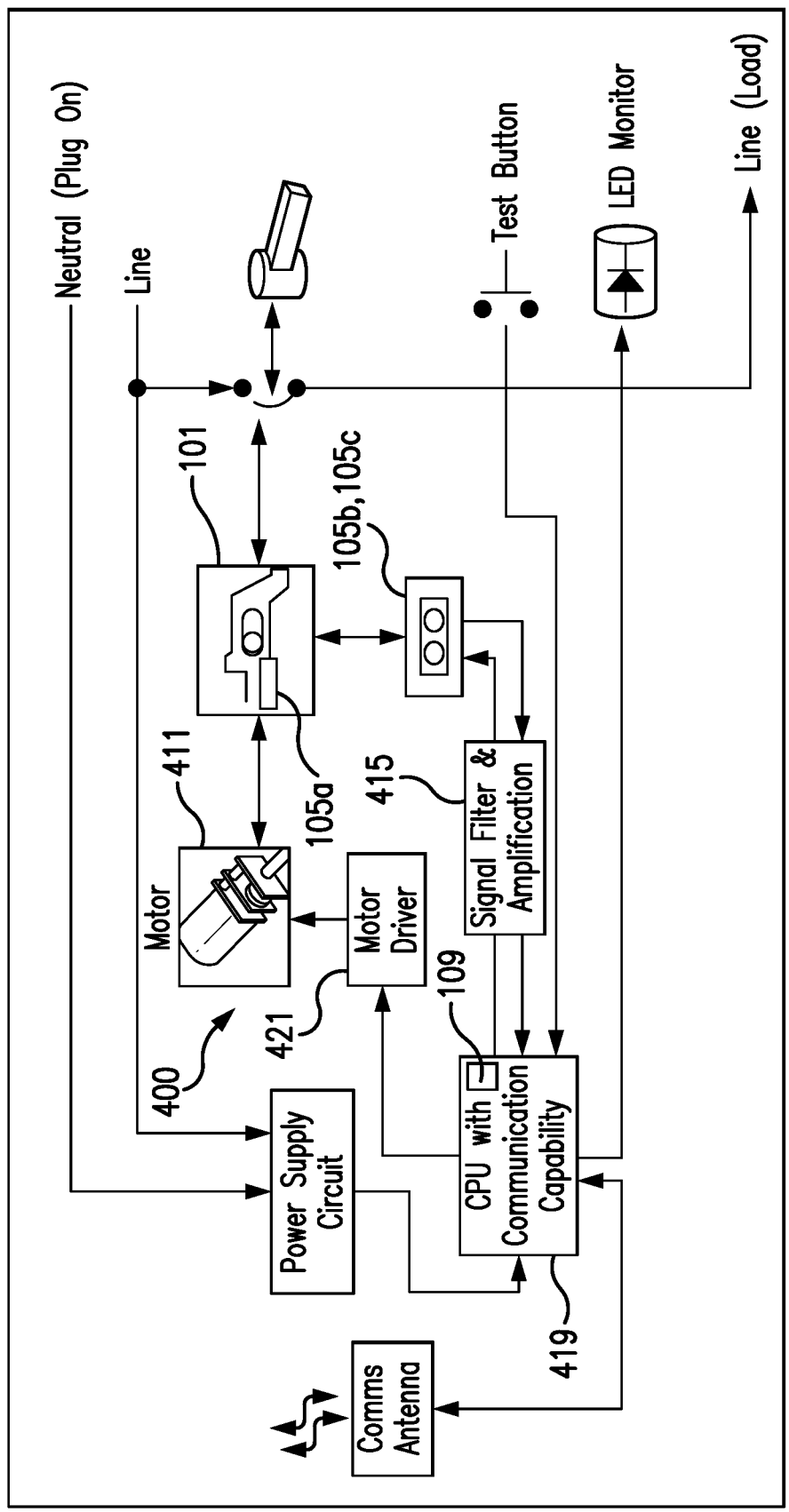
FIG. 13 is a system diagram of an embodiment of a circuit breaker assembly in accordance with this disclosure.

In certain embodiments, referring to FIG. 13, the assembly 400 can include a control module 419 operatively connected to the reluctance sensor system 105 to receive the position and/or the motion of the mechanism 101. The control module 419 can be configured to control a motor 411 connected to the mechanism 101 as a function of the position and/or the motion of the mechanism 101. For example, in certain embodiments, the control module 419 can be configured to position the mechanism 101 in a denial-of-service position such that a user cannot manually or remotely move the contactor 103 to the closed state from the open state (e.g., the position of which can be a function of the mechanical assembly of the circuit breaker that is configured to mechanically disable manual handle control). For example, the denial-of-service position can be between the first position and the second position.

In certain embodiments, e.g., as shown in FIG. 13, the assembly 400 can include the motor 411 and a control module 419 configured to control the motor 411 (e.g., via motor driver 421). In certain embodiments, the control module 419 can include the position module 109 (e.g., hosted on the same PCB 107 and/or software). In certain embodiments, the control module 419 can be configured to correlate a motor control command (e.g., from the control module 419) with a position of the mechanism 101 to determine a health of the motor 411 and/or mechanism 101. For example, the control module 419 can know if the motor 411 was to release the mechanism 101, and determine if the mechanism 101 was ever released. The control module 419 can determine how quickly, if at all, the motor 411 is able to pull the mechanism 101 to the first position, for example, and judge a health of the motor 411. The control module 419 can be configured to determine if the mechanism 101 is stuck in a position as it can sense the position of the mechanism 101 whether stationary or not. The control module 419 can be configured to determine if the mechanism 101 is in an expected position at any moment, or whether the mechanism is in the first position or the second position, for example. The control module 419 can be configured to use the position of the mechanism 101 as a feedback to purposefully position the mechanism 101 in a desired location (e.g., a denial of service state as described above, for example between a first position and a second position). Any suitable signal features can be used to determine any suitable characteristic of the mechanism 101 (e.g., speed, acceleration, position, etc.). Any other suitable correlations and diagnostic logic is contemplated herein.

Embodiments can include sensors that allow sensing of the continuous position of a mechanism, e.g., a slider in real time, e.g., within a circuit breaker. Embodiments can be configured to determine a "No motor movement" condition with such information, for example.

Certain embodiment can include a rounded core sensor. The core can include ferromagnetic material, e.g., iron steel, etc. and the position of this can change the output on a sense inductor based on oscillating input from a primary inductor. Coil turns of each inductor do not have to be the same, and any suitable number of turns for either or both are contemplated herein. Coil turns can define an amount of amplification needed (e.g., the more turns, the stronger the signal from the coils). A microcontroller can drive the primary inductor, and can receive a return signal from the sense inductor. Embodiments can provide information as to the mechanism position in stationary state, or can detect rates in motion for example.

Embodiments can include a rounded core position sensor, with the rounded core attached to a motorized slider. Embodiments can include a remote control mechanism sensor that reports to the microcontroller real time slider position feedback, real time slider speed feedback, and real time motor status (e.g., if speed of the slider is slower than expected, maybe the motor is failing). This can allow determination of end of life conditions, for example. End of life conditions can include a locked motor, open/damage motor, and mechanical fatigue, for example.

Embodiments can provide complete motor control contact open and close precision with calibration. Embodiments can automatically calibrate and determine maximum and minimum positions, for example. Embodiments can feedback the position of the slider in a denial-of-service zone to prevent the breaker turning on. This can be used to position the slider in such a position that the breaker cannot be mechanically or electrically turned on by the user, for example.

Embodiments can include a magnetic contactless sensor. Embodiments can include a magnetic encoder coupler (e.g., the reluctance variation device). Certain embodiments can include a planar linear position sensor, for example. For example, the bigger the magnetically reactive transversal section of the planar slider over the coils, the higher the induced field, and the higher the signal in the sense coil.

Certain embodiments can have a changing cross-sectional area of ferromagnetic material such that magnetically reactive volume changes as a function of position which changes flux/output on the sense coil. Certain embodiments can include a changing a 2D area of the slider component, for example.

Embodiments can include increased reliability with touchless magnetic feature as opposed to mechanical limiter switches. Embodiments can provide an easy assembly and motor initialization.

Embodiments can include a primary inductor and sensing inductor magnetically coupled through a U-shaped core, for example. The magnetic encoder coupler can be a planar slider that completes the circuit. A primary inductor can be driven by an output pin of a function controller. A sense inductor that output a voltage proportional to slider position and magnetic encoder coupler. The magnetic encoder coupler can include a unique geometric magnetic nonconductive material that works as a linear encoder located near a movable bar of the control mechanism. A definitive impulse magnetic connection can be used to determine the closed position, for example. Embodiments can include fast PCBA integration with seamless assembly, can provide continuous linear position, can detect mechanical wearing out e.g., using displacement ratio, and can include locked motor condition monitoring. Embodiments can include a feedback response that is immediate and fast. Certain embodiments can provide a denial of service by placing the slider within a defined slider denial of service zone (where mechanically enabled by the circuit breaker). Embodiments can include an electro-mechanical assembly with initial calibration possible to overcome any tolerances in mechanical parts. Any other suitable mathematical modeling capabilities can also be provided.

Embodiments can be applied to a mechanical handle of a circuit breaker (that is manually actuated) to provide position using a magnetic contactless sensor system. In certain embodiments, the handle can be shaped to be oblong to change a distance to the sensor as well as relative rotational position. The handle position sensor can report to the microcontroller real time handle position feedback and can provide complete handle position state with calibration, and increased reliability with the touchless magnetic feature. Embodiments can be environmentally robust from dust and debris.

Embodiments can include a magnetic contactless sensor for a remote control feature. Certain embodiments can provide information of position, speed, status, and robustness using a unique sensor. The sensor can include two separated windings (e.g., 100 turns or any other suitable number of turns). The first can be the primary winding fed with an alternating wave form from a function controller. The second winding can be the sense winding that relays the amplitude of the voltage to a function controller through a magnetically coupled rod or other suitable encoder/reluctance variation device. The variations in how the sensor can be assembled and the formation of the magnetic coupler component allow for many different uses. A few of those functions can include a motor and slider position detection method and can be extrapolated to other functions such as handle position detection method. Using this sensor application for a motor control mechanism can provide better feedback to the control system and deliver new advantageous features to the user. Embodiments can operate in a low voltage way to monitor a remote control feature in the circuit breaker.

Embodiments can include any suitable computer hardware and/or software module(s) to perform any suitable function (e.g., as disclosed herein). For example, the position module and control module can include any suitable computer hardware and/or software module(s) to perform any suitable function (e.g., as disclosed herein).

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit breaker assembly, comprising:
   a mechanism configured to be actuated by an operator, wherein the mechanism is configured to move between a first position and a second position to change a state of a contactor between a closed state and an open state;
   a reluctance variation device on, within, or forming a portion of the mechanism, wherein the reluctance variation device is a structure comprising a shape or composition that provides a varying magnetic effect;
   a sense inductor in magnetic communication with the reluctance variation device, wherein the sense inductor is configured to sense a magnetic field flux and output a sense signal, and wherein the reluctance variation device is configured to move relative to the sense inductor;
   a primary inductor configured to generate a reference magnetic field, wherein the primary inductor and the sense inductor are fixed relative to each other, and wherein the mechanism is configured to move relative to the sense inductor and the primary inductor such that the reluctance variation device is configured to move with the mechanism relative to the sense inductor and the primary inductor; and
   a position module operatively connected to the sense inductor and configured to determine a position of the mechanism based on the sense signal.

2. The assembly of claim 1, wherein the position module is operatively connected to the primary inductor to send a reference signal to the primary inductor to cause the primary inductor to output the reference magnetic field.

3. The assembly of claim 1, wherein the sense inductor and the primary inductor are non-coaxial coils.

4. The assembly of claim 3, wherein the sense inductor and the primary inductor are coils that are adjacent and have parallel, non-coaxial center axes.

5. The assembly of claim 4, further comprising a common conductive core within the sense inductor and the primary inductor.

6. The assembly of claim 3, wherein the sense inductor, the primary inductor, and the reluctance variation device are configured to form a magnetic loop, wherein a relative position of the reluctance variation device affects the reluctance of the magnetic loop such that the reference magnetic field is affected which changes the magnetic field flux sensed by the sense inductor.

7. The assembly of claim 6, wherein the reluctance variation device has a wedge shape with a varying thickness, wherein the reluctance variation device is configured to move over the sense inductor and the primary inductor to change the magnetic field flux sensed by the sense inductor.

8. The assembly of claim 7, wherein the reluctance variation device is on a lateral side of the mechanism.

9. The assembly of claim 6, wherein the reluctance variation device has a plate shape with a varying ferromagnetic and/or paramagnetic composition, wherein the reluctance variation device is configured to move over the sense inductor and the primary inductor to change the magnetic field flux sensed by the sense inductor.

10. The assembly of claim 6, wherein the reluctance variation device is configured to be rotationally moved over the sense inductor and the primary inductor to change the magnetic field flux sensed by the sense inductor.

11. The assembly of claim 1, wherein the mechanism is a motor operated slider.

12. The assembly of claim 1, wherein the mechanism is a mechanical breaker handle.

13. The assembly of claim 1, further comprising a control module operatively connected to the reluctance sensor system to receive the position and/or the motion of the mechanism, wherein the control module is configured to control a motor connected to the mechanism as a function of the position and/or the motion of the mechanism.

14. The assembly of claim 13, wherein the control module is configured to position the mechanism in a denial-of-service position such that a user cannot manually or remotely move the contactor to the closed state from the open state.

15. The assembly of claim 14, wherein the denial-of-service position is between the first position and the second position.

16. A circuit breaker assembly, comprising:
a mechanism configured to be actuated by an operator, wherein the mechanism is configured to move between a first position and a second position to change a state of a contactor between a closed state and an open state;
a plunger on, within, or forming a portion of the mechanism;
a sense inductor in magnetic communication with the plunger, and wherein the sense inductor is configured to sense a magnetic field flux and output a sense signal;
a primary inductor configured to generate a reference magnetic field, wherein the plunger is configured to pass through both the sense inductor and the primary inductor, wherein a relative position of the plunger affects the reference magnetic field to affect the magnetic field flux sensed by the sense inductor, wherein the mechanism is configured to move relative to the sense inductor and the primary inductor such that plunger is configured to move relative to the sense inductor and the primary inductor; and
a position module operatively connected to the sense inductor and configured to determine a position of the mechanism based on the sense signal, wherein the position module is operatively connected to the primary inductor to send a reference signal to the primary inductor to cause the primary inductor to output the reference magnetic field.

17. The assembly of claim 16, wherein the sense inductor and the primary inductor are coaxial coils.

18. The assembly of claim 17, wherein the plunger has a bar shape and is configured to pass axially through a center of each of the sense inductor and the primary inductor.

19. A circuit breaker assembly, comprising:
a mechanism configured to be actuated by an operator, wherein the mechanism is configured to move between a first position and a second position to change a state of a contactor between a closed state and an open state;
a reluctance variation device on, within, or forming a portion of the mechanism;
a sense inductor in magnetic communication with the reluctance variation device, and wherein the sense inductor is configured to sense a magnetic field flux and output a sense signal;
a primary inductor configured to generate a reference magnetic field, wherein the mechanism is configured to move relative to the sense inductor and the primary inductor such that reluctance variation device is configured to move relative to the sense inductor and the primary inductor, wherein the sense inductor, the primary inductor, and the reluctance variation device are configured to form a magnetic loop, wherein a relative position of the reluctance variation device affects the reluctance of the magnetic loop such that the reference magnetic field is affected which changes the magnetic field flux sensed by the sense inductor; and
a position module operatively connected to the sense inductor and configured to determine a position of the mechanism based on the sense signal, wherein the position module is operatively connected to the primary inductor to send a reference signal to the primary inductor to cause the primary inductor to output the reference magnetic field.

20. A circuit breaker assembly, comprising:
a mechanism configured to be actuated by an operator, wherein the mechanism is configured to move between a first position and a second position to change a state of a contactor between a closed state and an open state;
a reluctance sensor system operatively connected to the mechanism and configured to determine a position and/or a motion of the mechanism as a function of magnetic reluctance, wherein reluctance in the reluctance sensor system changes as a function of mechanism position; and
a control module operatively connected to the reluctance sensor system to receive the position and/or the motion of the mechanism, wherein the control module is configured to control a motor connected to the mechanism as a function of the position and/or the motion of the mechanism,
wherein the control module is configured to position the mechanism in a denial-of-service position such that a user cannot manually or remotely move the contactor to the closed state from the open state.

21. The circuit breaker assembly of claim 20, wherein the denial-of-service position is between the first position and the second position.

* * * * *